United States Patent [19]

Jones et al.

[11] 4,404,647
[45] Sep. 13, 1983

[54] DYNAMIC ARRAY ERROR RECOVERY

[75] Inventors: Darryl S. Jones; Donald W. Larkin; Michael F. Toner; Carleton E. Werve, all of Poughkeepsie, N.Y.

[73] Assignee: International Business Machines Corp., Armonk, N.Y.

[21] Appl. No.: 887,092

[22] Filed: Mar. 16, 1978

[51] Int. Cl.³ .................... G06F 13/00; G06F 11/00
[52] U.S. Cl. ................................................ 364/900
[58] Field of Search ... 364/900 MS File, 200 MS File; 235/303.3

[56] References Cited

U.S. PATENT DOCUMENTS

| | | | |
|---|---|---|---|
| 3,387,276 | 6/1968 | Reichow | 364/200 |
| 3,576,982 | 5/1971 | Duke | 235/153 |
| 3,623,019 | 11/1971 | Groth | 364/900 |
| 3,629,842 | 12/1971 | Taylor | 364/200 |
| 3,681,757 | 8/1972 | Allen et al. | 364/200 |
| 3,755,791 | 8/1973 | Arzubi | 235/303.3 |
| 3,889,237 | 10/1975 | Alferness et al. | 364/200 |
| 3,895,353 | 7/1975 | Dalton | 364/200 |
| 4,010,450 | 3/1977 | Porter et al. | 364/200 |
| 4,051,461 | 9/1977 | Hashimoto | 364/200 |

*Primary Examiner*—Harvey E. Springborn
*Attorney, Agent, or Firm*—Edward S. Gershuny

[57] ABSTRACT

Disclosed herein is a mechanism for use in a data processing system for recovering from errors detected when reading data from an array. At least two arrays, each of which may be a distinct portion of a single physical array, contain identical data. When data is written, it is written into both arrays. When data is read, it is read from one of the arrays. If an error is detected on readout, there will be a system retry and the other array will be accessed at the next read request. So long as no errors are detected, each successive read will be from the same array. An error detected on readout will cause the next read operation to access the other array.

10 Claims, 3 Drawing Figures

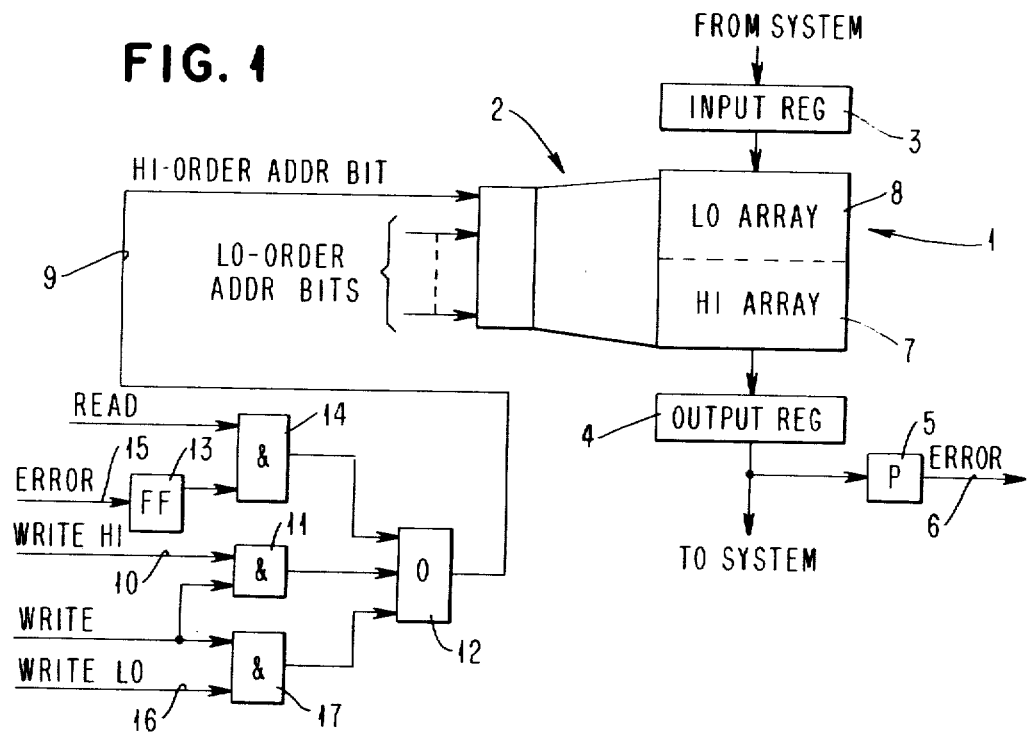
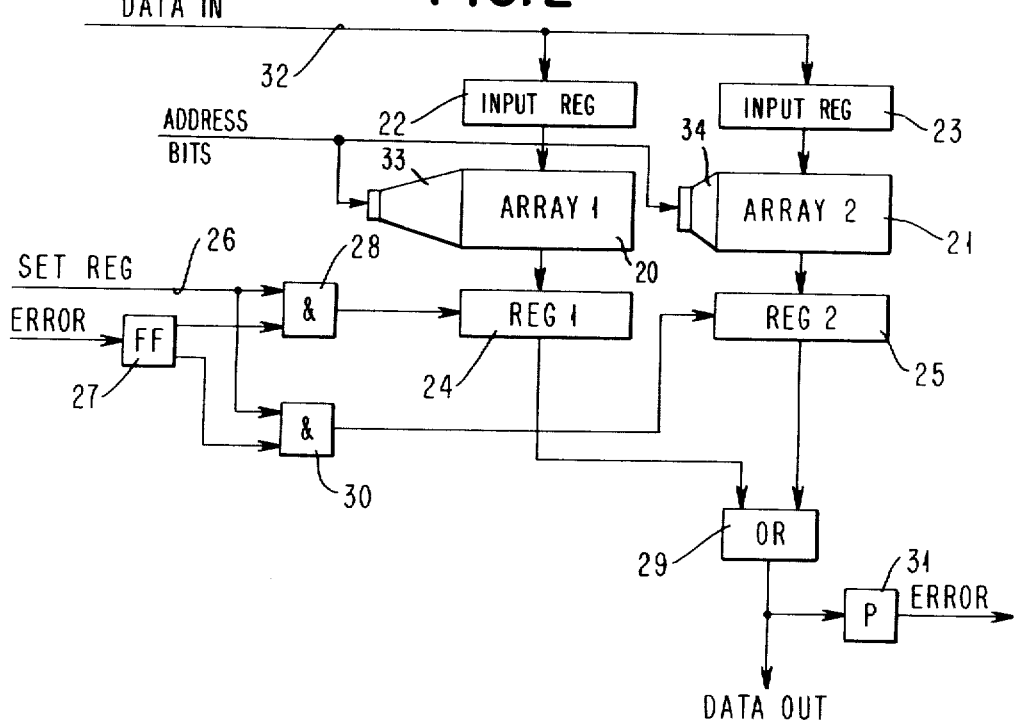

DYNAMIC ARRAY ERROR RECOVERY

DESCRIPTION

1. Technical Field

This invention relates to mechanisms for use in an electronic data processing system which will enable the system to continue operation despite the presence of ceratin defective hardware. More particularly, the invention pertains to mechanisms for overcoming the effects of faulty memory cells within a memory array.

The primary object of this invention is to provide memory arrays which will perform satisfactorily even when one or more memory locations are defective.

It is a more particular object of the invention to provide such a mechanism which will enable the data processing system to continue operation as long as any of the arrays is able to provide good data.

Yet another object is to accomplish the above with a mechanism which has only a small effect on system performance and which is inexpensive to implement.

2. Background Art

In the prior art, a variety of mechanisms have been utilized to deal with errors. One of the earliest approaches was to use error correcting codes. One drawback to using error correcting codes is that a large number of redundant bits must be carried with the data. This not only necessitates extra storage space but, sometimes even more significantly, requires many registers and data paths in the data processing system to be enlarged. Also, error correction is a time consuming process, and the error correction circuitry increases the complexity of the data processing system. Another major disadvantage of this prior art approach is that practical implementations can correct only a very small number of errors (typically only one or two) in a word. Thus, a malfunction that affected more than a small number of bits would result in an uncorrectable error.

Another approach found in the prior art is the use of redundant memory arrays. In one typical prior art approach, two or more arrays will contain identical information. Each time information is changed, the new information will be written into all the arrays. Each time information is to be read, it will be read from one of the arrays and checked (for example, by a parity check) for accuracy. When an error of a predetermined nature (commonly, one that is not correctable by a very simple error correction procedure) occurs, that array is logically disconnected from the system and only the remaining array(s) are subsequently used.

In yet another prior art approach which also uses redundant memory arrays, information is transmitted in parallel from two or more arrays to a central processing unit. When an error is detected in the information transmitted by one of the arrays, that array is disabled until it is repaired.

Although there are a number of prior art systems using redundant memory arrays, one feature they typically have in common is that, once an array has failed a set of predetermined criteria and has been disabled or logically disconnected, it remains disabled or disconnected until it is repaired even though most of that particular array might still be perfectly good and able to be utilized for storage of data.

BRIEF DESCRIPTION OF DRAWINGS

In the accompanying drawings forming a material part of this disclosure;

FIG. 1 is a schematic block diagram of an embodiment of this invention that is preferred in situations in which there will be little or no writing into the arrays.

FIG. 2 is a schematic block diagram of an embodiment of the invention that would be preferred in situations in which there is a significant amount of writing into the arrays.

DISCLOSURE OF INVENTION

Figure 3:
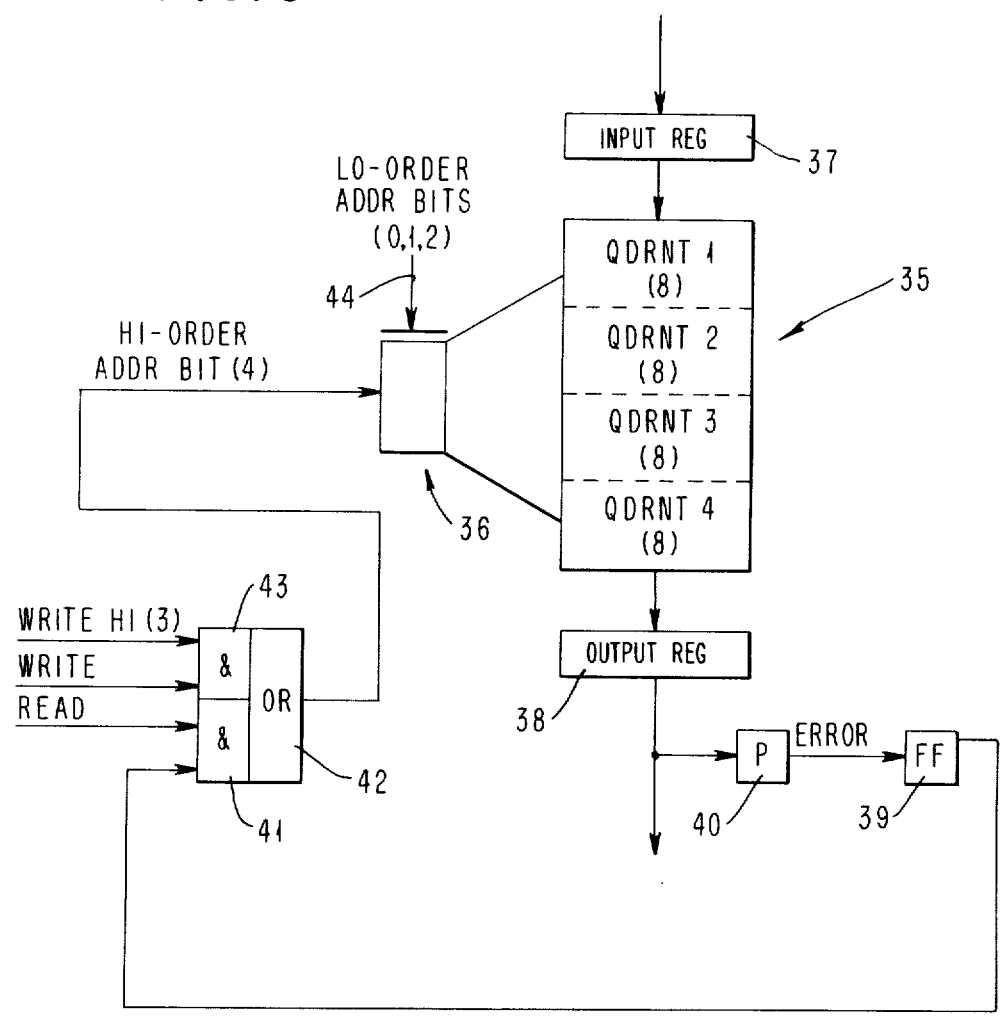
FIG. 3 is a schematic block diagram showing additional variations of the invention.

For further comprehension of the invention, and of the objects and advantages thereof, reference will be had to the following description and accompanying drawings, and to the appended claims in which the various novel features of the invention are more particularly set forth.

This invention is primarily intended for use in an electronic data processing system which includes the feature commonly known as "hardware retry". In a data processing system which includes this feature, if an error or malfunction is detected during the execution of a machine operation (such as reading from a memory array) the hardware of the data processing system will automatically do whatever is necessary for the system to try again to execute the operation; i.e., to "retry" it. If the error occurs again, there will be a second retry followed, if necessary, by further retries until a predetermined number "n" of attempts have been made. Retry mechanisms and electronic data processing systems utilizing them are quite well known and need not be described herein. For reference purposes, it is sufficient to note that one such system commonly available today, and in which this invention could be utilized, is the IBM System/370 Model 158. Information regarding that system may be found, for example, in IBM Maintenance Library, System/370 Model 158Maintenance/Diagrams Manual, published by International Business Machines Corporation as Form No. SY22-6912.

A first embodiment of the invention, as shown in FIG. 1, utilizes a memory array 1 with associated addressing circuitry 2, an input register 3 and an output register 4. Data that are to be written into the memory are received in input register 3 from other parts of the data processing system. Data that are read from the memory go to the remainder of the system from output register 4 and are checked for error by an error checking circuit 5 which typically is a parity circuit. If checking circuit 5 detects an error in the data, it will produce an ERROR signal on line 6. This ERROR signal will be utilized by a typical system to initiate an automatic hardware retry of the read operation which resulted in the detection of an error. What has been described to this point is quite conventional in well known electronic data processing systems and requires no further detailed description.

In accordance with one aspect of this invention, the array 1 is regarded as being logically segmented into two separate arrays, a high array 7 and a low array 8. Selective addressing of one or the other of these arrays 7 and 8 is accomplished by controlling the high-order address bit that is provided to addressing circuitry 2 on line 9.

In a system wherein the high array 7 and the low array 8 are used as read only arrays, the electronic data processing system need contain no mechanism for writing into them. In the event that this embodiment may be used in a system in which it is necessary to write into the arrays, high array 7 and low array 8 would need to be individually addressable. This is accomplished by providing, during one write operation, a write high signal on line 10 which, through AND gate 11 and OR gate 12 puts a "1" on line 9 to address high array 7; and providing, during a second write operation, a write low signal on line 16 which, through AND gate 17 and OR gate 12 puts a "0" on line 9 to address low array 8. (Actually, in the simple embodiment of FIG. 1, where line 9 carries only a single bit, the second write operation could be accomplished without line 16 and AND 17. Since line 16 and AND 17 would be necessary in some systems in order to accomplish addressing, they are shown here for completeness.)

When reading from the arrays, the state of the high-order address bit on line 9 will be controlled by the setting of a bistable device 13. When device 13 is on, AND 14 will be enabled by a READ signal to pass a "1" through OR gate 12 to cause high array 7 to be accessed. If bistable device 13 is off when a read signal arrives, the high-order address bit on line 9 will be "0" and reading will occur from low array 8.

The state of bistable device 13 is controlled by the output of error checker 5. Bistable device 13 is a device whose state will change each time a signal is received on its input line 15. Thus, each time that error detection circuit 5 detects an error, it will generate an ERROR signal which will cause bistable device 13 to change its state. This will cause subsequent read operations to access low array 8 if high array 7 had previously been accessed, or to access high array 7 if low array 8 had been previously accessed. As mentioned above, the ERROR signal will also cause the data processing system to retry the read operation. The retry will be to the alternate (low instead of high or high instead of low) array. Therefore, as long as the data processing system tries to read data from addresses which can provide good data from low array 8 or high array 7, good data will be available and the system will continue to operate. Failure will occur only when there is an attempt to access data at an address in which neither high array 7 nor low array 8 is capable of providing valid data.

Although this first embodiment requires the use of twice as much memory space as is actually needed to store the data, its implementation is relatively inexpensive. This array would typically utilize a single solid-state memory chip that is completely conventional in every way. A potential disadvantage of this embodiment is that, in order to write new information into the arrays, two write operations will be required; one to write information into high array 7 and one to write information into low array 8.

FIG. 2 shows a second preferred embodiment of the invention. This embodiment utilizes two physically distinct arrays 20 and 21 each having associated addressing circuitry 33 and 34, respective input registers 22 and 23, and respective output registers 24 and 25.

As is well known to those skilled in the art, it is quite common when reading information from a solid state memory to gate the information into an output register with a set register (SET REG) signal. In the embodiment of this invention shown in FIG. 2, selection of ARRAY1 20 or ARRAY2 21 is made by gating the SET REG pulse on line 26 to one of the output registers 24 or 25 depending upon the state of bistable device 27. When bistable device 27 is "on" the SET REG pulse will be transmitted through AND 28 to set REG1 24. This will cause data to be read from ARRAY1 into REG1 and through OR 29 to the rest of the data processing system. When bistable device 27 is "off" the SET REG signal will be conducted by AND 30 to enable data to be read from ARRAY2 21 into REG2 25 and then through OR circuit 29 to the remainder of the system. As before, data read from the arrays is checked in a checking circuit 31 which, if it detects an error, will generate the ERROR signal which will alter the state of bistable device 27, thus causing subsequent read operations to access data from the alternate array (ARRAY1 if ARRAY2 had previously been used, and ARRAY2 if ARRAY1 had previously been used).

When data is to be written into the arrays, it arrives from other parts of the system on line 32 and, through input registers 22 and 23 is written in parallel (that is, simultaneously) into both arrays.

In a data processing system in which this invention is used for arrays which must be written with some frequency, and in which system performance is a significant criterion, this second embodiment will generally be prefered. It is also noted that this second embodiment, which utilizes two separate arrays having separate addressing mechanisms will generally be even less susceptible to failure than the first embodiment described above.

FIG. 3 shows another embodiment of the invention. In this embodiment, a single physical memory array 35 (with its associated addressing circuitry 36, input register 37 and output register 38) is regarded logically as being broken down into four separate arrays, each consisting of one quadrant of the entire physical array 35. In this embodiment, as in the embodiment shown in FIG. 1, addressing a location within a quadrant is accomplished by transmitting low-order address bits from the data processing system directly to addressing mechanism 36. In this embodiment, because the addresses actually utilized are only one-fourth of the total physical array, there are two high-order address bits that are not directly used. In this embodiment, the lower-order of the two high-order address bits is constrained to be a "0" and the highest-order address bit is controlled, during a read operation, by the setting of a bistable device 39. The state of bistable device 39 is changed each time that error checking circuit 40 detects an error in the data in output register 38. During a read operation, AND 41 is enabled so that the state of device 39 controls the setting of the high-order address bit through OR circuit 42. When it is necessary to change data that is in the array, two write operations will be required as was the case with respect to the embodiment shown in FIG. 1. A write signal will enable AND 43 to pass a high-order address bit, provided by a write high signal or by a write low signal (not shown) through OR 42 to addressing circuitry 36 for the write operation.

The operation of the embodiment shown in FIG. 3 can be further appreciated by considering the following example. Assume that physical array 35 contains 32 addressable locations. Thus, there will be 8 addressable locations in each quadrant, and we assume that all memory read operations will attempt to access location 0,1,2,3,4,5, 6 or 7. This will be done by providing three low-order address bits (bits 0,1 and 2) on line 44 to the addressing circuitry 36. As stated above, of the two remaining high-order bits, the lower-order of the two (bit 3) is constrained to be "0". Thus, each address that is provided to the physical array 35 will be of the form X0XXX where X can equal either 1 or 0. With these constraints, no addresses in the second or fourth quadrants will be accessed. All accesses will be to addresses in the first and third quadrants. When data is to be written into this array, the system will provide addresses in exactly the same manner as was described above with respect to FIG. 1. It will supply four bits having the form XXXX. However, when utilizing the embodiment shown in FIG. 3, bit 3 provided by the system will be moved up one order of magnitude to become bit 4 for actually addressing the memory array.

This third embodiment is similar to the first embodiment in that its primary utility is in a system in which little or no writing is done into the arrays. It can be expected to be somewhat more reliable than the embodiment shown in FIG. 1 because physically noncontiguous portions of the physical array are used to store the two logical arrays. Certainly, a defect in one quadrant is less likely to extend into a non-adjacent quadrant.

The drawing shown in FIG. 3 can be used to illustrate other alternative embodiments of the invention. For example, the bistable device 39 could be replaced by a device having four stable states (such as, for example, a two-bit binary counter) and such a device could be used to generate all four combinations of the two high-order address bits for the physical array 35. Such an embodiment would have the advantage of providing four separate logical arrays in the system of FIG. 3. However, if it were necessary to change the information in the arrays, each change would need to be written four times. For this reason, this embodiment would probably not be used except as a read-only array. Another change that could be made in the third embodiment would be to utilize an address format of X1XXX (instead of X0XXX, as described above) resulting in all accesses being directed to the second and fourth quadrants (instead of to the first and third quadrants).

In the embodiment shown in FIG. 2, in addition to the two arrays shown, any desired number of additional parallel arrays could be utilized. However, in typical applications, the increase in system reliability will not be sufficient to justify additional arrays. Also with respect to FIG. 2, those skilled in the art will recognize that SET REG is a gating pulse which could, if desired, have been used to control gates between the arrays and the output registers or between the output registers and the rest of the system.

In still another significant embodiment of the invention, the two arrays need not necessarily contain identical data. If the invention is used, for example, to hold page tables (for a dynamic address translation system) it will be sufficient to do all reading from, and writing to, one of the logical arrays. Then, if an error is detected, the error signal will be used to switch to the other array as described above. The error signal will also be used to signal the system to invalidate the page table.

In an application where data are changing, and where previous data are not essential to system operation, this mechanism (switch to other array and invalidate page table) will generally be more efficient than a mechanism which maintains two current page tables.

In another variant of the invention, switching from one array to the other could be delayed until two (or more) successive read operations resulted in error indications. Such an embodiment would not be a prefered embodiment because it will generally increase the complexity and expense of a system without increasing its reliability.

In the embodiments described above, specific details of timing and control of the memory arrays themselves have not been described. These details are well known to those skilled in the art and a detailed description of them herein would serve no useful purpose. Conversely, such extraneous details might tend to obscure the nature of the invention. For the same reason, no detailed description has been provided of a data processing system in which this invention would be used. Clearly, it can be used in substantially any system which utilizes memory arrays. However, as mentioned above, it is prefered that the invention be embodied within a system which has automatic hardware retry capability.

While we have illustrated and described prefered embodiments of our invention, it is to be understood that we do not limit ourselves to the precise construction herein disclosed and the right is reserved to all changes and modifications coming within the scope of the invention as defined in the appended claims.

Having thus described our invention, what we claim as new, and desire to secure by Letters Patent is:

1. For use in a data processing system:
   two logically distinct memory arrays, containing identical data in corresponding locations thereof;
   selection means selectively and mutually exclusively logically connecting the outputs of said logically distinct memory arrays to other parts of said data processing system so the output of a first one of said logically distinct memory arrays is logically connected to other parts of said data processing system;
   detection means for detecting an error in data read from said logically distinct memory arrays; and
   reversing means responsive to the detection of a first error by said detection means to cause reversal of said selection means thereby logically connecting the output of the second of said logically distinct memory arrays to other parts of said data processing system;
   said reversing means being further responsive to the detection of another error by said detection means to again cause reversal of said selection means to logically reconnect the output of said first one of said logically distinct memory arrays to other parts of said data processing system.

2. The apparatus of claim 1 wherein:
   each of said memory arrays is physically separate from the other memory array.

3. The apparatus of claim 1 further including:
   means to write information simultaneously into both of said memory arrays.

4. The apparatus of claim 1 wherein:
   both of said logically distinct memory arrays are physically contained within a single physical memory array.

5. The apparatus of claim 4 wherein:
   each of said logically distinct memory arrays comprises one half of said single physical memory array.

6. The apparatus of claim 4 wherein:
   said two logically distinct memory arrays are located in two non-continguous portions of said single physical memory array.

7. The apparatus of claim 1, 4, 5 or 6 further including:
   writing means to write identical information into both of said logically distinct arrays.
8. The apparatus of claim 7 wherein:
   said writing means comprises means for causing the information to be written first into one of said logically distinct arrays and then into the other.
9. For use in a data processing system:
   two logically distinct memory arrays;
   selection means selectively and mutually exclusively logically connecting the outputs of said logically distinct memory arrays to other parts of said data processing system so the output of a first one of said logically distinct memory arrays is logically connected to other parts of said data processing system;
   detection means for detecting an error in data read from said logically distinct memory arrays; and
   reversing means responsive to the detection of a first error by said detection means to cause reversal of said selection means thereby logically connecting the output of the second of said logically distinct memory arrays to other parts of said data processing system;
   said reversing means being further responsive to the detection of another error by said detection means to again cause reversal of said selection means to logically reconnect the output of said first one of said logically distinct memory arrays to other parts of said data processing system.
10. The apparatus of claim 9 wherein:
    both of said logically distinct memory arrays are physically contained within a single physical memory array.

* * * * *